(12) United States Patent
Drerup et al.

(10) Patent No.: US 6,819,726 B2
(45) Date of Patent: Nov. 16, 2004

(54) DYNAMIC PHASE ALIGNMENT CIRCUIT

(75) Inventors: Bernard Charles Drerup, Austin, TX (US); Richard Siegmund, Jr., Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 760 days.

(21) Appl. No.: 09/732,000

(22) Filed: Dec. 7, 2000

(65) Prior Publication Data

US 2002/0071510 A1 Jun. 13, 2002

(51) Int. Cl.[7] .................................................. H03K 5/14
(52) U.S. Cl. ...................................... 375/371; 327/153
(58) Field of Search .............................. 375/371, 373, 375/376, 375; 327/141, 144, 145, 147, 149, 150, 152, 153, 161, 162, 163; 713/400, 401, 501, 503, 500

(56) References Cited

U.S. PATENT DOCUMENTS

| | | | | |
|---|---|---|---|---|
| 5,087,829 A | * | 2/1992 | Ishibashi et al. ............. 327/152 |
| 5,144,170 A | * | 9/1992 | Parker ......................... 327/141 |
| 5,216,302 A | * | 6/1993 | Tanizawa ..................... 327/157 |
| 5,515,403 A | * | 5/1996 | Sloan et al. .................. 375/371 |
| 5,550,514 A | * | 8/1996 | Liedberg ..................... 331/1 A |
| 5,964,880 A | * | 10/1999 | Liu et al. ..................... 713/401 |
| 6,111,925 A | * | 8/2000 | Chi ............................. 375/354 |
| 6,333,653 B1 | * | 12/2001 | Floyd et al. ................. 327/163 |
| 6,594,772 B1 | * | 7/2003 | Tsai et al. ................... 713/500 |
| 6,622,255 B1 | * | 9/2003 | Kurd et al. .................. 713/503 |

* cited by examiner

*Primary Examiner*—Jean B. Corrielus
*Assistant Examiner*—Khanh Cong Tran
(74) *Attorney, Agent, or Firm*—Carr LLP; Robert M. Carwell

(57) ABSTRACT

The invention includes a circuit for aligning the phase of a clock derived from a frequency multiplied version of a reference clock used in a computer system. The dynamic phase alignment circuit includes a few logic gates to perform the operation of delaying the derived clock, detecting its phase misalignment, and correcting such misalignment by incrementally aligning the phase of the derived clock to the reference clock. The invention is capable of aligning the phase of a derived clock to a reference clock in a computer system whose CPU operates at as high a frequency as about 500 MHz or higher.

8 Claims, 2 Drawing Sheets

DYNAMIC PHASE ALIGNMENT CIRCUIT

BACKGROUND OF THE INVENTION

1. Field of the Invention

The invention relates generally to an electronic circuit for dynamic phase alignment and, more particularly, to a self-adjusting circuit which can be used to achieve phase alignment in coincident pulse edges between two clocks with the same frequency, when one of the clocks is derived from a frequency-multiplied version of the other.

2. Description of the Related Art

In a digital computer system, there may be many subsystems or components that operate at different clock speeds. For example, a central processing unit (CPU) may operate at 500 MHz, whereas a memory unit may operate at 100 MHz. This is true for systems created with discrete components as well as for those created as a highly integrated ASIC system-on-chip (SOC) which contains many different subsystems in a single ASIC chip.

A common scheme for clocking subsystems is to use a low speed reference clock and a phase-locked loop (PLL) to create one or more higher-frequency multiplied primary clock(s). While PLLs generally ensure phase alignment between such primary clocks, they cannot guarantee phase alignment in other clocks which are derived from the primary clocks by an external clock generation logic circuit. Phase alignment between a reference clock and a derived clock is required to allow synchronous interface between them.

Two common methods for achieving phase alignment between clocks include a) a one-time handshake between clock domains and b) a scheme of using the derived clock as feedback to a PLL. Each of these methods can impose limitations on maximum frequency, minimum frequency, and/or permitted clocking ratios.

Accordingly, there exists a need for accurate phase alignment of different clocks in a computer system. In addition, there is a need for a reliable phase alignment technique that can be implemented easily and also is capable of dealing with very high speed clock circuits.

SUMMARY OF THE INVENTION

The present invention provides an inexpensive, reliable solution to phase alignment problems that face many system designers and other engineers. The invention includes a dynamic phase alignment circuit comprising a delay circuit connected to a derived clock tree, a detecting circuit portion connected to the delay circuit and to a reference clock tree, and a correcting circuit portion connected to the detecting circuit portion and to a clock generator.

In another aspect of the invention, the phase of the derived clock is dynamically aligned by delaying the derived clock, detecting the phase difference between the delayed clock and the reference clock, and correcting the phase of the delayed clock by incrementally realigning the phase of the delayed clock until alignment is achieved.

The present invention has numerous advantages over other phase alignment schemes. For example, the dynamic phase alignment circuit of the present invention requires only a minimal number of logic gates to implement, thereby minimizing additional cost of implementing this invention.

Moreover, the present invention presents a phase alignment solution that satisfies the stringent timing requirements of clock generation logic without requiring strict timing challenges. The dynamic phase alignment circuit of the present invention will allow a CPU clock as fast as 500 MHz or faster to be used with reference clocks that are typically 33 or 66 MHz.

Additionally, the present invention has the advantage of being able to recover alignment automatically and without additional logic circuits, even if a derived clock is stopped and then restarted during normal operation. Such a stoppage could occur during power management operations that would stop clocks to minimize power.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

Figure 1:
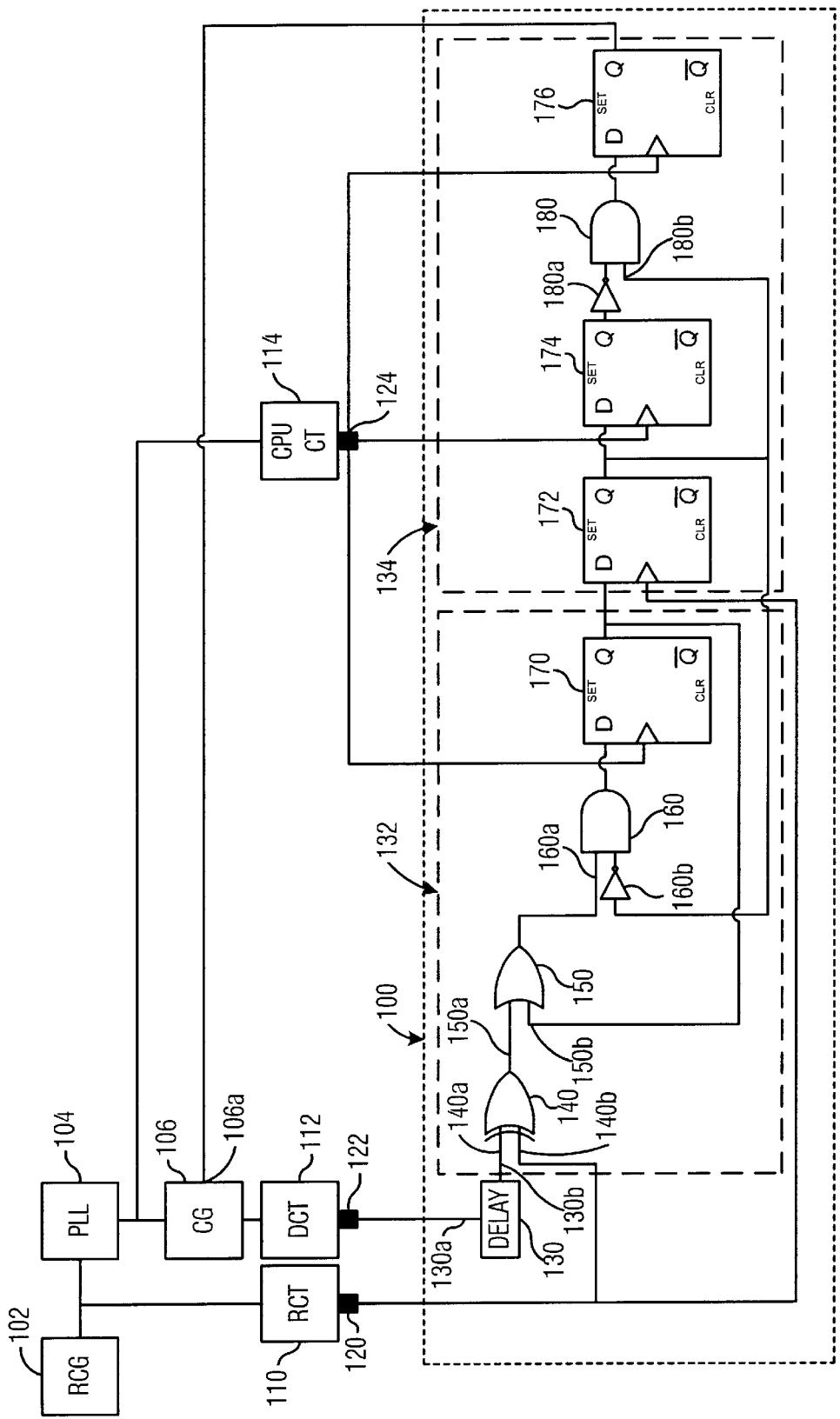
FIG. 1 is a gate-level schematic diagram of the phase alignment circuit of the present invention.

Referring to FIG. 1, the reference numeral 100 generally designates a gate-level view of the phase alignment circuit embodying features of the present invention. The phase alignment circuit 100 is connected to other circuit components such as a reference clock generator (RCG) 102, a phase-locked loop (PLL) 104, and clock generator (CG) 106. The RCG 102 is configured and connected for generating a reference clock signal to the PLL 104, and the PLL 104 is configured for generating a single high speed CPU clock signal to the CG 106. The CG 106 is configured for generating a low speed derived clock signal. These clock signals go through reference clock tree (RCT) 110, derived clock tree (DCT) 112, and CPU clock tree (CPU CT) 114 which are used to carry the clock signals over to different parts of a system.

As shown in FIG. 1, the phase alignment circuit 100 includes a delay circuit 130, the detecting circuit portion 132 connected to the delay circuit 130 and to a correcting circuit portion 134, and the correcting circuit portion 134. The detecting circuit portion 134 includes an XOR gate 140, an OR gate 150, an AND gate 160 with inverted input 160b, and a D flip-flop 170. The correcting circuit portion includes a D flip-flops 172, 174, and 176 and an AND gate 180 with inverted input 180a. These logic circuit components are interconnected as discussed in further detail below. It is noted that the inverted inputs 160b and 180a may be implemented using inverter logic circuits that are either integrated with or distinct from the respective AND gates 160 and 180. A detailed interconnection between these gates and D flip-flops is described below.

The delay circuit 130 includes an input 130a which is connected to an end 122 of the DCT 112, and an output 130b which is connected to an input 140a of the XOR logic circuit 140.

The XOR gate 140 includes an input 140b which is connected to an end 120 of the RCT 110, and an output which is connected to an input 150a of the OR gate 150.

The OR gate 150 includes an input 150b which is connected to the output Q of D flip-flop 170, and an output which is connected to an input 160a of the AND gate 160.

The AND gate 160 includes an inverted input 160b which is connected to an output Q of the D flip-flop 172 and an output of and an output which is connected to the input D of D flip-flop 170.

The output Q of the D flip-flop 170 is connected to the input D of D flip-flop 172. The output Q of the D flip-flop 172 is connected to the input D of the D flip-flop 174. The output Q of the D flip-flop 174 is connected to an inverted input 180a of the AND gate 180. The output of the AND gate 180 is connected to the input D of the D flip-flop 176. The output Q of the D flip-flop 176 is connected to the gate input 106a of CG 106.

The D flip-flops 170, 174, and 176 are connected to the end 124 ofthe CPU CT 114 such that they are enabled by a CPU clock signal taken at the end 124 of the CPU CT 114. The D flip flop 172 is connected to the end 120 of the RCT 110 such that it is enabled by the reference clock taken at the end 120 of the RCT 110.

It is noted here that the lines connecting the circuit components as shown in FIG. 1 do not cause a propagation delay regardless of the different lengths of such lines. Therefore, the clock signals at the ends 120, 122, and 124 are substantially free of clock skew, and are directly fed into the phase alignment circuit 100 without further delay from the lines connecting the clock trees 120, 122, and 124 and the various circuit components of the phase alignment circuit 100.

It is considered that the RCG 102, PLL 104, CG 106, clock trees 110, 112, and 114, delay circuit 130, logic gates 140, 150, 160, and 180, and D flip-flops 170, 172, 174, and 176 are well-known in the art and, therefore, will not be discussed in further detail herein, except insofar as necessary to describe the present invention.

Normally, the CPU clock signal is expected to run at some large multiple of the reference clock signal, whereas the derived clock signal is expected to run at the same frequency as the reference clock signal. The CG 106 has registers which are clocked by the CPU clock and, therefore, the derived clock generated by the CG 106 may be shifted by one or more CPU clock pulse periods. For example, if the CPU clock is running at 400 MHz and the derived clock is at 33 MHz, then the ratio between the CPU and derived clocks is 12:1, resulting in 11 incorrect alignments and only one correct alignment.

The phase alignment circuit 100 automatically detects and corrects any phase alignment error between the derived and reference clocks. These clocks are measured at the end 122 of the DCT 112 and the end 120 of the RCT 110.

The detection of the phase alignment error is largely performed by the detection circuit portion 132 having the XOR gate 140, OR gate 150, AND gate 160, and D flip-flop 170. The correction of the error is largely performed by the correcting circuit portion 134 having AND gate 180 and D flip-flops 172, 174, and 176.

Since the derived clock signal at the end 122 of the DCT 112 is compared with the reference clock at the end 120 of the RCT 110, it is important to ensure that the derived clock lines up with the end 120 of the RCT 110. Typically, clock trees are designed to have identical propagation delays from the output of the PLL 104 to the end 124 of the CPU CT 114 and from the output of the PLL 104 to the end 122 of DCT 112. This is because the PLL 104 is normally designed to compensate the propagation delays for the clock pulses arriving at the end 124 of the CPU CT 114 and the end 122 of the DCT 112. The same reference clock signal, however, arrives at the end 120 of the RCT 110 without going through the PLL 104. Thus, the propagation delay is not compensated at the end 120 of the RCT 110. While typical delays vary, for this example, it is assumed that the delay is about 1.2 ns. The delay circuit 130 is therefore inserted to delay the derived clock for about the same period of time (e.g., about 1.2 ns), before the detection circuit compares the derived and reference clocks.

In the operation of the phase alignment circuit 100 for detecting phase alignment error, the XOR gate 140 generates logic 1 whenever there is a difference in input logic levels. Therefore, if the logic state of the derived clock pulses does not match that of the reference clock pulses at a given point of time, the XOR gate 140 will generate logic level 1. Otherwise, it will generate logic level 0.

The XOR gate 140 compares the two input signals by sampling the two input signals only at rising edges of the CPU clock, because the D flip-flop 170 is enabled by the CPU clock signal. Once a logic level 1 is sample by the D flip-flop 170, the OR gate 150 serves to hold that state until the output state of D flip-flop 170 is changed. The AND gate 160 is used to force D flip-flop 170 to return to logic level 0 after maintaining logic level 1 for a period of time sufficient to propagate the output of D flip-flop 170 to the input of D flip-flop 172, and subsequently observe the output of D flip-flop 172 change to logic level 1. It is noted that D flip-flop 170 is enabled by the reference clock signal.

In the operation of the correcting circuit portion 134, a single realignment pulse having a width of one CPU clock period is generated, once logic level 1 is detected at the output of D flip-flop 172. The final D flip-flop 176 is used to ensure that the pulse coming out of the AND gate transitions as soon after a rising CPU clock edge as possible, thus allowing maximum time for the realignment pulse to be used by the CG 106.

The realignment pulse is used as a gating signal for the CG 106, thereby resulting in an occasional stoppage of the derived clock for a single CPU period. This has the effect of gradually moving the previously misaligned derived clock toward the reference clock. The phase alignment circuit as described herein allows a single adjustment pulse for every two reference clock periods. This circuit, therefore, continues to delay the derived clock until alignment is achieved.

Figure 2:
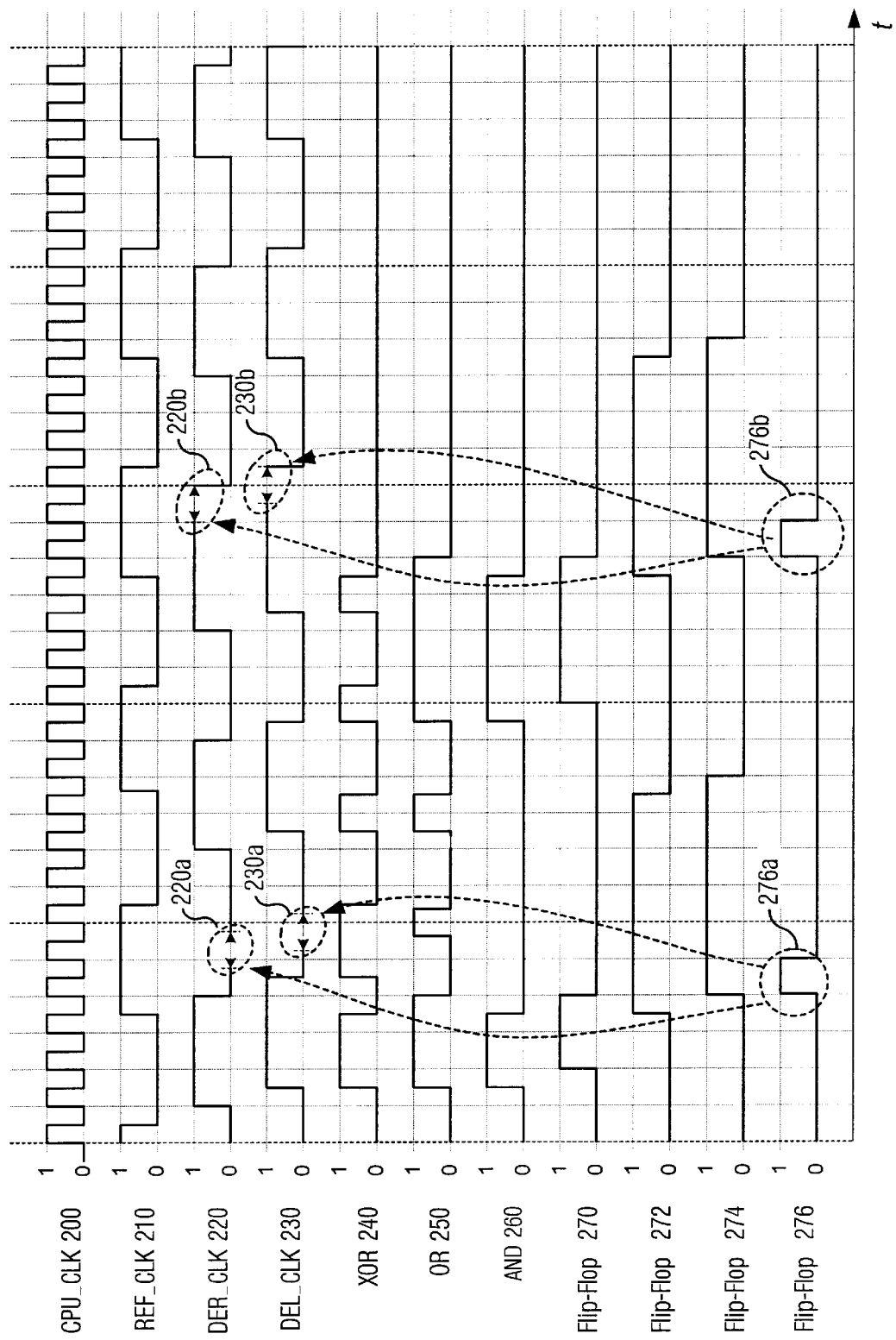
FIG. 2 is a timing diagram showing the phase alignment method of the present invention.

Now referring to FIG. 2, a detailed timing diagram is shown to provide an example of various clock signals and other pulse signals that may be generated by the present invention described above with respect to FIG. 1. It is noted, however, that the timing diagram depicted by FIG. 2 is provided only for the limited purpose of illustrating an example of one embodiment of the invention, and therefore that the invention is not limited to the exact pulses shown therein.

Accordingly, CPU_CLK 200 represents the CPU clock present at the end 124 of the CPU CT 114. REF_CLK 210 shows the reference clock signal present at the end 120 of the RCT 110. In this timing diagram example, the frequency of the REF_CLK 210 is six-times multiplied by the PLL 104 to generate the CPU_CLK 200.

DER_CLK 220 represents the derived clock signal present at the end 122 of the DCT 112 of FIG. 1. As mentioned earlier in relation to FIG. 1, the DER_CLK 220 first goes through the delay circuit 130 of FIG. 1, whose output generates DEL_CLK 230. The DEL_CLK 230 therefore is a delayed version of the DER_CLK 220.

The DEL_CLK 230 is compared with the REF_CLK 210 in the XOR 140 of FIG. 1. As shown in FIG. 2, the clocks REF_CLK 210 and DEL_CLK 230 are initially misaligned by two CPU clock periods. For these misaligned portions of the two clocks, the XOR gate 140 of FIG. 1 generates the clock pulse XOR 240, which generates logic level 1 whenever there is a difference in the logic states in the two clocks REF_CLK 210 and DEL_CLK 230.

The OR gate 150 and the AND gate 160 of FIG. 1 generates the pulse outputs OR 250 and AND 260, respectively. Similarly, the D flip-flops 170, 172, 174, and 176 of FIG. 1 generate the signal outputs 270, 272, 274, and 276, respectively. It is noted here that the D flip-flop 172 is enabled by the reference clock signal present at the end 120 of the RCT 110, whereas the other D flip-flops 170, 174, and 176 are enabled by the CPU clock signal present at the end 124 of CPU CT 114.

According to the operation of these gates as discussed above with respect to FIG. 1, the AND gate 180, and thus the D flip-flop 176, first generate a single realignment pulse 276a. This single realignment pulse 276a is first used as a clock gating signal for the clock signals DER_CLR 220 and the DEL_CLR 230, thereby resulting in the stoppage of the clock signals DER_CLR 220 and DEL_CLK 230 for a single CPU period, as shown schematically by dashed outlines 220a and 230a. Since the REF_CLK 210 and the DEL_CLK 230 were initially misaligned by two CPU clock periods, the misalignment is now by one CPU clock period. The phase alignment circuit of this invention detects the misalignment once again, and generates another single realignment pulse 276b, which is also used as a clock gating signal for the clock signals DER_CLR 220 and DEL_CLR 230, thereby resulting in the stoppage of the clock signals DER_CLR 220 and DEL_CLK 230 for another single CPU period, as shown schematically by dashed outlines 220b and 230b. This process of detecting and correcting phase alignment error is gradually done by one CPU pulse period at a time.

Since the derived clock is generated using latches that are also clocked by the high speed CPU clock signal, there are likely to be strict timing requirements on any clock gating signal. As an example of how to stop the derived clock briefly, the realignment pulses such as 276a and 276b can be used to gate the C-clock input of a clock splitter found in the IBM SA12E technology library. It may be necessary to use standard asynchronous interfacing methods to allow the realignment pulse generated by the D flip-flop 176 to be used by a clock splitter in the CG 106, since the CG 106 receives an earlier version of the CPU clock.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered obvious and desirable by those skilled in the art based upon a review of the foregoing description of preferred embodiments. Accordingly, it is appropriate that the appended claims be construed broadly and in a manner consistent with the scope of the invention.

What is claimed is:

1. A dynamic phase alignment circuit comprising:
a delay circuit connected to a derived clock tree connected to a clock generator (CG), said delay circuit including a logic circuit capable of delaying clock signals;
a detecting circuit portion connected to said delay circuit and to a reference clock tree (RCT), the RCT being connected to a reference clock generator (RCG), said detecting circuit portion being configured for detecting the phase difference between a first clock signal output from said delayed circuit and a second clock signal output from said reference clock tree, wherein the detection circuit is at least configured to have a plurality of logic gates, and wherein at least one logic gate of the plurality of logic gates is at least configured to receive feedback from an output of the detection circuit as a function of a signal that is enabled by a clock pulse received from a clock generator tree; and
a correcting circuit portion connected to said detecting circuit portion and to said CG, and configured for correcting the phase of said first clock signal by incrementally realigning the phase of said first clock signal to the phase of said second clock signal until said alignment is achieved.

2. A dynamic phase alignment circuit comprising:
a delay circuit connected to a derived clock tree connected to a clock generator (CG), said delay circuit including a logic circuit capable of delaying clock signals;
a detecting circuit portion connected to said delay circuit and to a reference clock tree (RCT), the RCT being connected to a reference clock generator (RCG), said detecting circuit portion being configured for detecting the phase difference between a first clock signal output from said delayed circuit and a second clock signal output from said reference clock tree, and wherein the detecting circuit further comprises:
an XOR gate having a first input connected for receiving a signal from said delay circuit, a second input connected for receiving a signal from said reference clock tree, and an output for outputting an XOR signal;
an OR gate having a first input connected for receiving said XOR signal, a second input connected for receiving a first Q signal output from a first D flip-flop, and an output for outputting an OR signal;
a first AND gate having a first input connected for receiving said OR signal, a second input connected for receiving an inverted signal of a second Q signal output from a second D flip-flop, and an output for outputting a first AND signal; and
the first D flip-flop having a D input connected for receiving said first AND signal, and a Q output for outputting a first Q signal; and
a correcting circuit portion connected to said detecting circuit portion and to said CG, and configured for correcting the phase of said first clock signal by incrementally realigning the phase of said first clock signal to the phase of said second clock signal until said alignment is achieved.

3. A dynamic phase alignment circuit comprising:
a delay circuit connected to a derived clock tree connected to a clock generator (CG), said delay circuit including a logic circuit capable of delaying clock signals;
a detecting circuit portion connected to said delay circuit and to a reference clock tree (RCT), the RCT being connected to a reference clock generator (RCG), said detecting circuit portion being configured for detecting the phase difference between a first clock signal output from said delayed circuit and a second clock signal output from said reference clock tree; and
a correcting circuit portion connected to said detecting circuit portion and to said CG, and configured for correcting the phase of said first clock signal by incrementally realigning the phase of said first clock signal to the phase of said second clock signal until said alignment is achieved, and wherein the correcting circuit portion further comprises:
a first D flip-flop having a D input connected for receiving a first Q signal from a second D flip-flop of said detecting circuit portion, and a Q output for outputting a second Q signal;

a second D flip-flop having a D input connected for receiving said second Q signal, and a Q output for outputting a third Q signal;

a first AND gate having a first input connected for receiving an inverted signal of said third Q signal, a second input connected for receiving said second Q signal output from said first D flip-flop, and an output for outputting a first AND signal; and a third D flip-flop having a D input connected for receiving said first AND signal, and a Q output for outputting a fourth Q signal to said CG.

4. A dynamic phase alignment circuit comprising:

a delay circuit connected to a derived clock tree connected to a clock generator (CG), and configured for delaying clock pulses received from said derived clock tree;

an XOR gate having a first input connected for receiving a signal from said delay circuit, a second input connected for receiving a signal from a reference clock tree connected to a reference clock generator (RCG), and an output for outputting an XOR signal;

an OR gate having a first input connected for receiving said XOR signal, a second input connected for receiving a first Q signal output from a first D flip-flop, and an output for outputting an OR signal;

a first AND gate having a first input connected for receiving said OR signal, a second input connected for receiving an inverted signal of a second Q signal output from a second D flip-flop, and an output for outputting a first AND signal;

the first D flip-flop having a D input connected for receiving said first AND signal, and a Q output for outputting a first Q signal;

the second D flip-flop having a D input connected for receiving said first Q signal, and a Q output for outputting a second Q signal;

a third D flip-flop having a D input connected for receiving said second Q signal, and a Q output for outputting a third Q signal;

a second AND gate having a first input connected for receiving an inverted signal of said third Q signal, a second input connected for receiving said second Q signal output from said second D flip-flop, and an output for outputting a second AND signal; and a fourth D flip-flop having a D input connected for receiving said second AND signal, and a Q output for outputting a fourth Q signal to said CG.

5. The dynamic phase alignment circuit of claim 4, wherein said Q output of said fourth D flip-flop is connected to said CG for outputting said fourth Q signal as a gating signal of said CG.

6. A method for dynamically aligning the phase of a first clock signal, said first clock signal being derived from a frequency multiplied version of a second clock signal, the method comprising the steps of:

delaying said first clock signal to compensate any difference in propagation delay in said first and second clock signals;

detecting phase difference between said delayed first clock signal and said second clock signal by employing a plurality of logic gates, wherein the detecting employs feeding back an output of a detected phase difference to at least one logic gate of the plurality of logic gates as a function of a signal that is enabled by a clock pulse received from a clock generator tree; and correcting said phase of said delayed first clock signal by incrementally realigning said phase of said delayed first clock signal to the phase of said second clock signal until said alignment is achieved.

7. The method of claim 6, wherein the step of detecting comprises the step of comparing the phase of said delayed first clock signal with the phase of said second clock signal.

8. A method for dynamically aligning the phase of a first clock signal, said first clock signal being derived from a frequency multiplied version of a second clock signal, the method comprising the steps of:

delaying said first clock signal to compensate any difference in propagation delay in said first and second clock signals;

detecting phase difference between said delayed first clock signal and said second clock signal; and correcting said phase of said delayed first clock signal by incrementally realigning said phase of said delayed first clock signal to the phase of said second clock signal until said alignment is achieved, wherein the step of correcting further comprises:

generating a single realignment pulse having a width of one CPU clock period; and using said generated single realignment pulse as a clock gating signal for said derived clock signal in order to stop said derived clock signal for a duration of said single realignment pulse, thereby delaying said delayed clock signal for a duration of said one CPU clock period.

* * * * *